METHOD FOR ETCHING THIN LAYERS OF OXIDE OR NITRIDE

Filed Dec. 8, 1967

INVENTOR
M. P. LEPSELTER
BY
Sylvan Sherman
ATTORNEY

United States Patent Office 3,585,091
Patented June 15, 1971

3,585,091
METHOD FOR ETCHING THIN LAYERS OF OXIDE OR NITRIDE

Martin P. Lepselter, New Providence, N.J., assignor to Bell Telephone Laboratories, Incorporated, Murray Hill and Berkeley Heights, N.J.

Filed Dec. 8, 1967, Ser. No. 689,090
Int. Cl. C23f *1/02;* H01l *7/00*
U.S. Cl. 156—16 2 Claims

ABSTRACT OF THE DISCLOSURE

This application discloses a method for selectively etching a thin oxide or nitride layer on a semiconductive body. In particular, an oxide or nitride layer is selectively etched by depositing a thin layer of an active metal upon it, inducing a chemical reduction reaction between the active metal and the oxide or nitride in selected areas, and selectively removing the more readily dissolved reacted areas.

Two methods of inducing the reduction reaction are disclosed. In one embodiment the reaction is induced by selectively heating the active metal above the area to be etched. In a second embodiment the reaction is selectively induced by forming the layer of active metal in a predetermined masking configuration and uniformly heating the resulting structure.

This method of selective etching avoids many of the disadvantages of the photoresist technique. It is particularly useful in the fabrication of diffusion-resistant masks for semiconductor device fabrication.

This invention relates to methods for selectively etching thin oxide and nitride layers.

BACKGROUND OF THE INVENTION

The selective etching of thin oxide and nitride layers is of great importance in the fabrication of microelectronic circuits and circuit devices. For example, in the manufacture of diffused semiconductor devices, it is typical to form an oxide diffusion-resistant layer over a semiconductor substrate and to selectviely etch through the oxide layer to form a diffusion-resistant mask of prescribed configuration. A nitride diffusion-resistant layer can be used for the same purpose; however, heretofore it has been considered impractical to use nitride masks because of the difficulty of selectively etching the nitride layer.

The usual process for etching a diffusion-resistant layer is the photoresist technique as is described, for example, in Patent 2,802,760, issued to L. Derick and C. J. Frosch on Aug. 13, 1957, and adapted in the manner disclosed in Pat. 3,122,817, issued to J. Andrus on Mar. 3, 1964. In essence, the diffusion-resistant mask is produced by forming an etch-resistant mask of photoresist on the oxide layer and then etching away the unprotected portion of the layer. The photoresist is then removed, leaving the desired diffusion mask. More specifically, the photoresist mask is formed by depositing a layer of photoresist material on the oxide layer and then either selectively irradiating it with ultraviolet light or selectively bombarding it with an electron beam. [See Schlabach and Rider, Printed and Integrated Circuitry (1963), at page 355.] The unexposed photoresist is removed from the surface by well-known techniques leaving an etch-resistant mask. Conventional etching techniques are then used to etch the oxide outside the mask.

Although the photoresist technique is accurate and widely accepted commercially, it has certain limitations and disadavntages which make it difficult to employ and expensive to use. Among its limitations is the fact that it is difficult to make photoresist materials that can withstand the etchants required for nitrides and certain oxides. For example, phosphoric acid is required to etch typical nitride layers, but this acid also etches the usual photoresist materials. Moreover, several disadvantages arise even when the photoresist technique can be used. For example, the photoresist material is typically nonuniform, and it thus requires testing and modification from batch to batch. In addition, the use of photoresist generally leaves on the surface of the semiconductor an organic residue which is not uniform from device to device and which also deteriorates the electrical properties of the device.

The electron beam activated photoresist technique incurs additional disadvantages due to electrical charging. More specifically, since the resist material is typically dielectric, the use of an electron beam produces a charge buildup on the resist-covered surface. The charge buildup, in turn, produces a defocusing effect on the beam. Accordingly, the resolution of the mask thus formed is reduced. In addition, the charge buildup can damage the underlying oxide or nitride layer.

SUMMARY OF THE INVENTION

In accordance with the present invention, an oxide or nitride layer is selectively etched by the steps of depositing a layer of an active metal upon the layer to be etched, selectively inducing a chemical reduction reaction between the material to be etched and the active metal, and then removing the resulting reacted area by conventional etching techniques.

A simplified flow diagram of the method is as follows:

Depositing active metal
↓
Selectively inducing reduction reaction
↓
Removing reacted area In a first illustrative embodiment of the invention, the chemical reaction is induced by selectively heating the active metal above the area to be etched. In accordance with this embodiment, selective etching can be accomplished without the use of a photoresist or contact mask.

In a second embodiment, the chemical reaction is selectively induced by forming the layer of active metal in a predetermined masking configuration and heating the resulting structure uniformly. This results in a chemical reaction selectively in only those portions of the oxide or nitride layer immediately under the active metal mask.

BRIEF DESCRIPTION OF THE DRAWINGS

The invention and its objects and advantages will be more clearly understood from the following detailed description taken in conjunction with the drawings in which.

DETAILED DESCRIPTION

Figure 1:
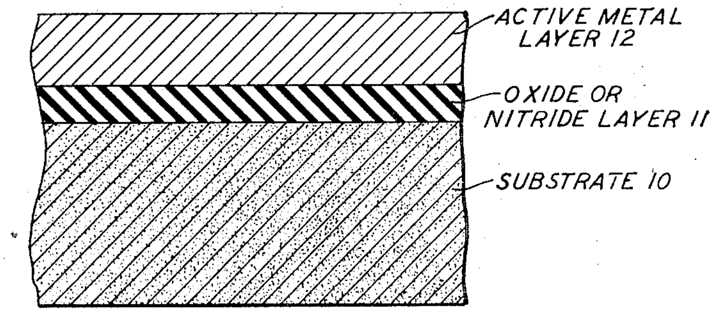
FIG. 1 illustrates a typical workpiece used in the practice of a first illustrative embodiment of the invention.

FIG. 1, which illustrates a typical workpiece used in the practice of the invention shows a substrate 10 upon which there is disposed a thin layer 11 of an oxide or a nitride that is to be etched. Typically, substrate 10 is a semiconductor wafer such as a slice of silicon having a diameter and thickness of the order of one inch and 0.020 inch, respectively. In many applications layer 11 is adapted to be suitable for use as a diffusion-resistant layer, and it is desired to provide openings in the layer having a diameter of a few microns or tens of microns. The thickness of layer 11 is typically in the range between a thousand and a few tens of thousands of angstroms. For example, a suitable diffusion-resistant oxide coating for a silicon substrate can be grown by oxidation of the substrate in a steam atmosphere as disclosed in Pat. 2,930,722, issued to J. R. Ligenza on Mar. 29, 1960.

The first step, in accordance with one embodiment of the invention, is to coat the surface to be etched, such as by sputtering or vacuum evaporation, with a thin layer 12 of an active metal such as zirconium, titanium or hafnium. In general, active metal layer 12 should have sufficient amount per unit area to be capable of chemically reducing the underlying oxide or nitride area to the desired depth. (For example, since titanium will hold approximately half its weight in oxygen, an appropriate thickness of a titanium layer is one having a per unit area weight equal to at least twice the per unit area weight of oxygen in the oxide layer to be etched.)

The second step is to selectively induce a chemical reduction reaction between the active metal and those portions of the oxide or nitride layer to be selectively etched.

Figure 2:
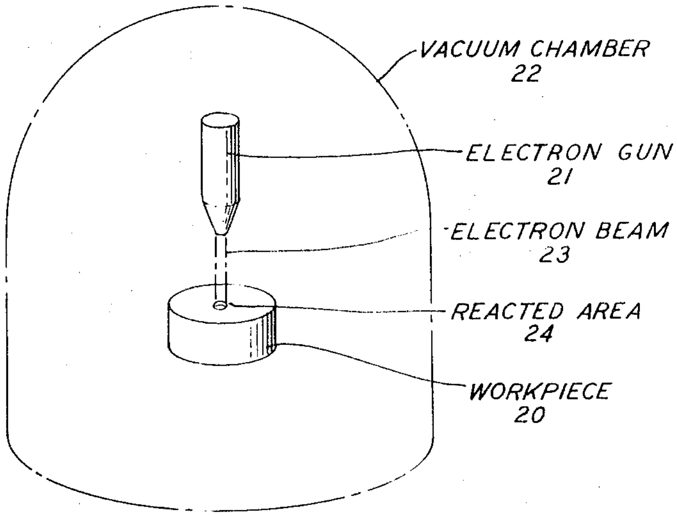
FIG. 2 illustrates apparatus useful in the practice of the first illustrative embodiment of the invention.

The step of selectively inducing a reduction reaction is carried out by selectively heating the active metal layer above the area to be etched, such as by the use of an electron beam or a laser beam. FIG. 2, for example, illustrates apparatus useful for carrying out this step using an electron beam. In the figure there is shown a workpiece 20 such as that described in connection with FIG. 1, and an electron gun 21, both of which are located within a chamber 22 capable of being evacuated. Workpiece 20 and electron gun 21 are so positioned with respect to one another that electrons from the gun can be used to bombard the active metal layer on the workpiece. Electron gun 21 can be any one of the many known structures capable of producing and directing a focused beam 23 of electrons to a preselected spot.

In operation, the chamber is evacuated to a relatively low pressure, typically below $10^{-5}$ torr, and an electron beam is directed onto selected spots on the active metal layer. The heat generated when the focused beam strikes the target area on the workpiece causes a reduction reaction in the underlying region, as, for example:

$$Zr+SiO_2 \rightarrow ZrO_2+Si \text{ or } 3Zr+Si_3N_4 \rightarrow Zr_3N_4+3Si$$

Advantageously, beam 23 comprises a series of intense pulses rather than a continuous beam so that the heating effect is localized rather than spread out. The localized reacted area 24 resulting from the localized heating typically comprises a solid solution of the reduced material and the oxide or nitride of the active metal in the active metal. The resulting solid solution is more readily dissolved than the original oxide or nitride layer.

The third step is to etch away the reacted area. In general, reacted area 24 is simply dissolved by an appropriate etchant. For example, dilute hydrofluoric acid or hot concentrated sulfuric acid with a trace of HF are appropriate etchants for selectively dissolving a reacted area comprising a solid solution of $ZrO_2$ and Si in $Z_1$. They are also appropriate etchants for a solid solution of $Zr_3N_4$ and Si in Zr.

There are several significant advantages in the above-described method of selective etching. For example, since no resist layer is required, the hereinbefore described disadvantages of photoresist masking are avoided. A second advantage is that there is no defocusing of the electron beam as is the case when electron beam activated photoresist is used. This advantage accrues because the target is metallic and, hence, does not charge up locally as does a dielectric target. Thus, submicron resolution can be readily obtained. In addition, the reaction between the active metal and the material to be etched is a simple, thermally controlled one and is found to lead to reproducible results.

Figure 3:
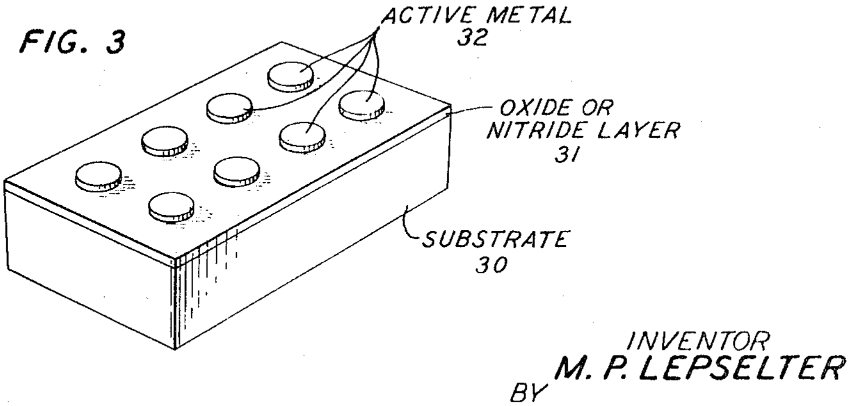
FIG. 3 illustrates a typical workpiece used in the practice of a second illustrative embodiment of the invention.

In a second embodiment of the invention, the selective induction of the reduction reaction is achieved by forming the active metal layer in a predetermined masking configuration corresponding to the desired pattern and heating the resulting structure uniformly. FIG. 3, for example, illustrates a typical workpiece useful in the practice of this second embodiment of the invention. In the figure there is shown a substrate 30 upon which there is disposed a thin layer 31 of oxide or nitride to be etched. Disposed upon thin layer 31 are a plurality of circular masking configurations 32 comprising thin layers of an active metal. (The dimensions and materials useful in this process are substantially the same as those described in connection with FIG. 1.) The masking configurations can be easily produced by depositing a uniform layer of active metal on the oxide or nitride layer and using conventional photoetching techniques on the active metal. Alternatively, the desired configuration can be achieved by depositing the active metal initially in this configuration by way of a mask. When the resulting structure is uniformly heated, a chemical reduction reaction takes place only in the regions underlying the active metal. As in the case of the first embodiment, the resulting reacted portion can be easily dissolved away.

In all cases it is understood that the above-described arrangements are illustrative of only one of the many possible specific embodiments which can represent application of the principles of the present invention. Numerous and varied other arrangements can be readily devised in accordance with these principles by those skilled in the art without departing from the spirit and scope of the invention.

What is claimed is:

1. A method for selectively etching a thin layer of oxide or nitride comprising the steps of:

depositing a layer of an active metal on said thin layer of oxide or nitride;

irradiating with an electron beam those portions of said active metal layer immediately above the area to be etched thereby selectively heating said portions and selectively inducing a chemical reduction reacting between said thin layer and said active layer;

and selectively removing the resulting reacted area.

2. The method according to claim 1 wherein said thin layer of oxide or nitride comprises an oxide or nitride of silicon and is disposed upon a silicon substrate.

References Cited

UNITED STATES PATENTS

| | | | |
|---|---|---|---|
| 3,346,384 | 10/1967 | Gaynor | 156—17UX |
| 3,354,064 | 11/1967 | Letter | 117—62X |
| 3,426,422 | 2/1969 | Deal | 156—17X |
| 3,436,285 | 4/1969 | Wilkes | 156—17 |

WILLIAM A. POWELL, Primary Examiner

U.S. Cl. X.R.

117—201; 148—179; 156—17